(12) United States Patent
Taguchi et al.

(10) Patent No.: US 8,022,137 B2
(45) Date of Patent: Sep. 20, 2011

(54) SILICONE RESIN COMPOSITION FOR OPTICAL SEMICONDUCTOR DEVICES

(75) Inventors: Yusuke Taguchi, Annaka (JP); Junichi Sawada, Annaka (JP); Kenji Hagiwara, Annaka (JP); Shoichi Osada, Annaka (JP); Kazutoshi Tomiyoshi, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/569,433

(22) Filed: Sep. 29, 2009

(65) Prior Publication Data

US 2010/0081748 A1    Apr. 1, 2010

(30) Foreign Application Priority Data

Sep. 30, 2008   (JP) .................. 2008-253764
Aug. 31, 2009   (JP) .................. 2009-200919

(51) Int. Cl.
*C08L 83/00*   (2006.01)

(52) U.S. Cl. .......... 524/588; 524/430; 525/477; 528/14; 528/33

(58) Field of Classification Search ............... 524/588
See application file for complete search history.

(56) References Cited

U.S. PATENT DOCUMENTS

| 4,102,970 | A * | 7/1978 | Deubzer et al. | ............ 264/176.1 |
| 6,509,423 | B1 * | 1/2003 | Zhu | ................ 525/478 |
| 2006/0035092 | A1 | 2/2006 | Shimizu et al. | |
| 2006/0229408 | A1 | 10/2006 | Shimizu et al. | |
| 2010/0273927 | A1 * | 10/2010 | Taguchi et al. | ............... 524/433 |

FOREIGN PATENT DOCUMENTS

| JP | 2-189958 A | 7/1990 |
| JP | 2005-306952 A | 11/2005 |
| JP | 2006-77234 A | 3/2006 |

OTHER PUBLICATIONS

Forbes et al, A Viscosity-Molecular Weight Relationship for Polydimethylsiloxanes, Journal of Applied Polymer Science, vol. V, issue 14, pp. 153-156 (1961).*

European Search Report dated Dec. 16, 2009 issued in corresponding European Application No. 09171894.0.

* cited by examiner

*Primary Examiner* — Marc S Zimmer
*Assistant Examiner* — Lindsay Nelson
(74) *Attorney, Agent, or Firm* — Birch, Stewart, Kolasch & Birch, LLP

(57) ABSTRACT

The present invention provides a silicone resin composition for an optical semiconductor device, comprising (A) 100 parts by mass of an organopolysiloxane having a weight average molecular weight of from 500 to 20000, reduced to polystyrene, and represented by the following average compositional formula (1), $$(CH_3)_a Si(OR^1)_b (OH)_c O_{(4-a-b-c)/2} \quad (1)$$

wherein $R^1$ is an organic group having 1 to 4 carbon atoms and a, b, and c are numbers satisfying the equations: $0.8 \leq a \leq 1.5$, $0 \leq b \leq 0.3$, $0.001 \leq c \leq 0.5$, and $0.801 \leq a+b+c < 2$, (B) 3 to 200 parts by mass of a white pigment,
(C) 400 to 1000 parts by mass of an inorganic filler other than said white pigment,
(D) 0.01 to 10 parts by mass of a condensation catalyst, and
(E) 2 to 50 parts by mass of an organopolysiloxane comprising a linear diorganopolysiloxane moiety represented by the following formula (2),

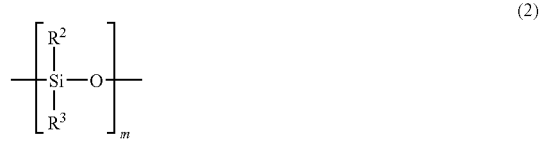

(2)

wherein $R^2$ and $R^3$ are, independently of each other, a group selected from the group consisting of a hydroxyl group, an alkyl group having 1 to 3 carbon atoms, a cyclohexyl group, a vinyl group, a phenyl group and an allyl group, and wherein m is an integer of from 5 to 50.

4 Claims, 1 Drawing Sheet

SILICONE RESIN COMPOSITION FOR OPTICAL SEMICONDUCTOR DEVICES

CROSS REFERENCES

This application claims the benefits of Japanese Patent Application Nos. 2008-253764 filed on Sep. 30, 2008 and 2009-200919 filed on Aug. 31, 2009, the contents of which are hereby incorporated by reference.

FIELD OF THE INVENTION

The present invention relates to a silicone resin composition for optical semiconductor devices, specifically to a silicone resin composition comprising an organopolysiloxane having a silanol group and an organopolysiloxane having a linear diorganopolysiloxane moiety with a particular length, wherein formability is good and problems, such as warpage of a semiconductor device in curing and discoloration, specifically yellowing, of a cured body due to light degradation, are markedly reduced.

BACKGROUND OF THE INVENTION

Optical semiconductor elements, such as light emitting diodes (LED), are used as indicators or light sources. Recently, their output is higher and their wavelength is shorter, so that there is a problem that resin materials present near the optical semiconductor elements degrade due to light to turn yellow and, therefore, light output lowers.

The following Patent Literature 1 discloses, as a resin composition for encapsulating optical semiconductors, an epoxy resin composition in a B stage which comprises an epoxy resin, a curing agent, and a curing promoter. It describes that bisphenol A epoxy resin or bisphenol F epoxy resin is mainly used as the epoxy resin and triglycidyl isocyanate may be used. However, the afore-mentioned composition has the aforesaid yellowing problem, particularly when a semiconductor element is lightened at a high temperature or for a long time.

Patent Literature 2 discloses a composition which comprises an epoxy resin derived from isocyanuric acid, as a heat-resistant and light-resistant epoxy resin composition for encapsulating light emitting elements. However, light resistance of the composition is insufficient, again.

Patent Literature 3 discloses a resin composition for encapsulating LED devices, which composition comprises an organopolysiloxane having a weight average molecular weight of $5 \times 10^2$ or higher and a condensation catalyst. However, the composition is directed to applications where high transparence is required, rather than to applications where white pigments are used, such as reflectors.

Meanwhile, recently, sizes of molded package become bigger, for instance, in Matrix Array Package (MAP) method and, therefore, warpage in curing of an encapsulating resin becomes a serious problem. Large warpage causes various malfunctions in a package carrying step or a package cutting step. The afore-mentioned compositions are unsatisfactory in this respect, either.

Patent Literature 1: Japanese Patent Application Laid-Open Hei-02-189958
Patent Literature 2: Japanese Patent Application Laid-Open 2005-306952
Patent Literature 3: Japanese Patent Application Laid-Open 2006-77234

DISCLOSURE OF THE INVENTION

The Problems to be Solved by the Invention

The purpose of the present invention is to provide a silicone resin composition for optical semiconductor devices which provide a cured body, wherein warpage in the optical semiconductor device in curing is less and whiteness, heat-resistance, and light resistance are better.

Means to Solve the Problems

The present invention is a silicone resin composition for an optical semiconductor device, comprising
(A) 100 parts by mass of an organopolysiloxane having a weight average molecular weight of from 500 to 20000, reduced to polystyrene, and represented by the following average compositional formula (1),

$$(CH_3)_a Si(OR^1)_b (OH)_c O_{(4-a-b-c)/2} \quad (1)$$

wherein $R^1$ is an organic group having 1 to 4 carbon atoms and a, b, and c are numbers satisfying the equations: $0.8 \leq a \leq 1.5$, $0 \leq b \leq 0.3$, $0.001 \leq c \leq 0.5$, and $0.801 \leq a+b+c<2$,
(B) 3 to 200 parts by mass of a white pigment,
(C) 400 to 1000 parts by mass of an inorganic filler other than said white pigment,
(D) 0.01 to 10 parts by mass of a condensation catalyst, and
(E) 2 to 50 parts by mass of an organopolysiloxane comprising a linear diorganopolysiloxane moiety represented by the following formula (2),

wherein $R^2$ and $R^3$ are, independently of each other, a group selected from the group consisting of a hydroxyl group, an alkyl group having 1 to 3 carbon atoms, a cyclohexyl group, a vinyl group, a phenyl group and an allyl group, and wherein m is an integer of from 5 to 50.

EFFECTS OF THE INVENTION

The composition of the present invention does not cause distortion in a device when cured and can give a cured body which is white, heat resistant and light resistant, on account of the combination of organopolysiloxane (E) which has a linear diorganopolysiloxane moiety having a particular length with organopolysiloxane (A) which has a branched structure.

THE BEST EMBODIMENTS OF THE INVENTION

(A) Organopolysiloxane

Figure 1:
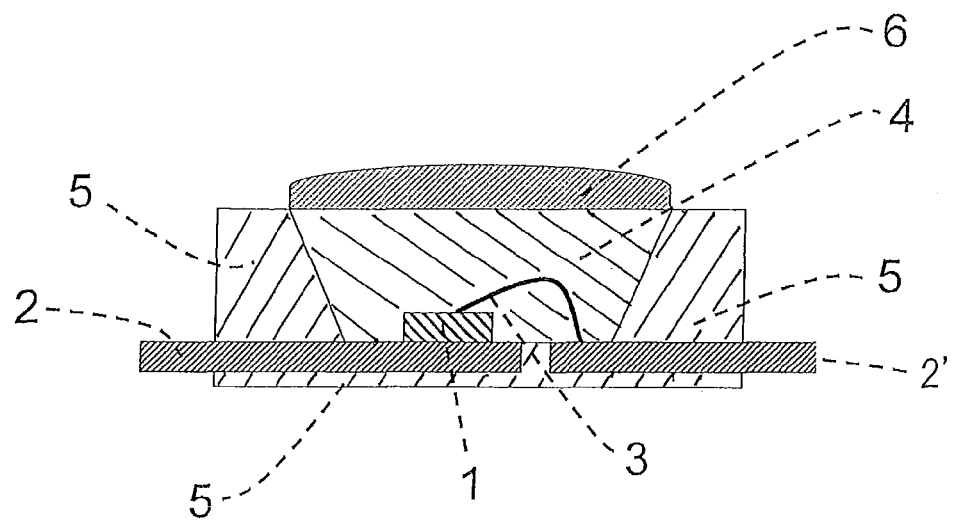
FIG. 1 is a cross sectional view which indicates an example of an optical semiconductor device where the silicone resin composition of the present invention is adopted.

Organopolysiloxane (A) has a silanol group and forms a cross linked structure in the presence of condensation catalyst (D). In the afore-mentioned average compositional formula (1), $R^1$ is an organic group having 1 to 4 carbon atoms and a, b, and c are numbers which satisfy the equations: $0.8 \leq a \leq 1.5$, $0 \leq b \leq 0.3$, $0.001 \leq c \leq 0.5$, and $0.801 \leq a+b+c < 2$.

A composition which comprises an organopolysiloxane with "a" less than 0.8, where "a" represents an amount of $CH_3$, is not preferred because such a composition provides a too hard cured body, so that cracks may occur. Meanwhile, if a exceeds 1.5, such a resin does not solidify. Preferably, a satisfies the equation $0.9 \leq a \leq 1.2$, more preferably $0.9 \leq a \leq 1.1$.

If b, content of $OR^1$, exceeds 0.3, the molecular weight is so small that crack resistance may be insufficient. Preferably, b satisfies the equation $0.001 \leq b \leq 0.2$, more preferably $0.01 \leq b \leq 0.1$. The group, $OR^1$, can be quantified in infrared absorption spectrum (IR) and alcohol quantification by alkali cracking.

If c, content of an OH group bound to an Si atom, exceeds 0.5, such an organopolysiloxane gives, after condensation in thermal curing and/or condensation with component (E), a cured body which has a high stiffness but has a poor crack resistance. If c is less than 0.001, a melting point of the polyorganosiloxane tends to be higher, so that problems may occur in workability. If no bond is formed with component (E), component (E) is not fixed within a cured body, so that stiffness of the cured body tends to be low and solvent resistance tends to be bad. Preferably, c satisfies the equation $0.01 \leq C \leq 0.3$, more preferably $0.05 \leq c \leq 0.2$. As conditions for controlling c, a complete condensation rate of alkoxy groups of a raw material is preferably from 86% to 96%. If the rate is less than 86%, a melting point tends to be low, whereas if it exceeds 96%, a melting point tends to be too high.

Accordingly, a total of a, b, and c preferably satisfies the equation, $0.911 \leq a+b+c \leq 1.8$, more preferably $1.0 \leq a+b+c \leq 1.5$.

In the above average compositional formula (1), $R^1$ is a same or different organic group having 1 to 4 carbon atoms. Examples of $R^1$ include an alkyl group such as a methyl group, an ethyl group, an isopropyl group, and a n-butyl group; and alkenyl groups such as a vinyl group and an allyl group. A methyl group and an isopropyl group are preferred because a raw material is easily available.

Organopolysiloxane (A) has a weight average molecular weight of from 500 to 20000, preferably from 1000 to 10000, more preferably from 2000 to 8000, reduced to a polystyrene standard, as determined by GPC. If the molecular weight is less than 500, such an organopolysiloxane is difficult to solidify. If the molecular weight exceeds 20000, a viscosity is so high that flowability may be too lower.

Component (A) can generally be represented by the combination of unit Q ($SiO_{4/2}$), unit T ($CH_3SiO_{3/2}$), and unit D (($CH_3)_2SiO_{2/2}$). In this notation for component (A), a molar ratio of unit T is preferably 70 mole % or higher, desirably 75 mole % or higher, particularly 80 mole % or higher, relative to the total moles of the siloxane units. If the molar ratio of unit T is less than 70%, overall balance among the stiffness, adhesion, and appearance may be lost. The remaining part other than unit T may be units D and Q. These units may preferably account for less than 30 mole % or less of component (A). A melting point tend to be higher as units D and Q increase.

Component (A) can be obtained as a hydrolysis condensate of an organosilane represented by the following general formula (3),

$$(CH_3)_n SiX_{4-n} \quad (3)$$

wherein X is a halogen atom such as chlorine or an alkoxy group having 1 to 4 carbon atoms, and n is 1, 2, or 0. X is preferably a halogen atom, particularly a chlorine atom to obtain a organopolysiloxane in a solid state.

Examples of the silane compounds represented by the afore-mentioned formula (3) include methyltrichlorosilane, methyltrimethoxysilane, methyltriethoxysilane, dimethyldichlorosilane, dimethyldimethoxysilane, dimethyldiethoxysilane, tetrachlorosilane, tetramethoxysilane, and tetraethoxysilane.

Hydrolysis and condensation of the afore-mentioned silane compounds having a hydrolysable group can be carried out in a conventional method, for instance, in the presence of acid catalysts such as acetic acid, hydrochloric acid, and sulfuric acid or alkali catalysts such as sodium hydroxide, potassium hydroxide, and tetramethylammonium hydroxide. For instance, when a silane which has a chlorine atom as a hydrolysable group is used, water added generates hydrochloric acid as a catalyst to give a hydrolysis condensate with a desirable molecular weight.

An amount of water to be added in the hydrolysis and condensation is typically 0.9 to 1.6 moles, preferably 1.0 to 1.3 moles, relative to total 1 mole of the hydrolysable groups, such as a chlorine atom, in the afore-mentioned silane compound having a hydrolysable group. When this amount falls within the range from 0.9 to 1.6 moles, the composition mentioned below exhibits excellent workability and the cured body exhibits excellent toughness.

The afore-mentioned silane compound which has a hydrolysable group is hydrolyzed preferably in an organic solvent such as alcohols, ketones, esters, cellosolves and aromatic compounds. Specific examples of the preferred solvents include alcohols such as methanol, ethanol, isopropyl alcohol, isobutyl alcohol, n-butanol and 2-butanol, and aromatic compounds such as toluene and xylene. A combination of isopropyl alcohol and toluene is more preferred for better curability of the composition and toughness of the cured body.

The temperature for the hydrolysis and condensation is preferably from 10 to 120 degrees C., more preferably from 20 to 100 degrees C. When the reaction temperature falls on the afore-mentioned range, a solid hydrolysis condensate does not cause gelling and is usable in the subsequent step.

When methyltrichlorosilane is used, water and isopropyl alcohol are added to methyltrichlorosilane dissolved in toluene to cause partial hydrolysis at a reaction temperature of from −5 degrees C. to 100 degrees C. Then, water is further added in such an amount that all of the unreacted chlorine atoms hydrolyze and the resulting hydrolysate reacts with each other to give a solid silicone polymer with a melting point of 76 degrees C., represented by the following formula.

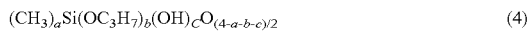

$$(CH_3)_a Si(OC_3H_7)_b (OH)_c O_{(4-a-b-c)/2} \quad (4)$$

wherein a, b, and c are as defined above.

Examples of the compound represented by the afore-mentioned average compositional formula (4) include those represented by the following formula (5) or (6).

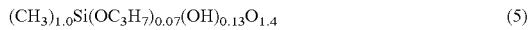

$$(CH_3)_{1.0} Si(OC_3H_7)_{0.07} (OH)_{0.13} O_{1.4} \quad (5)$$

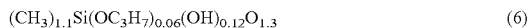

$$(CH_3)_{1.1} Si(OC_3H_7)_{0.06} (OH)_{0.12} O_{1.3} \quad (6)$$

(B) White Pigment

White pigment (B) is added in order to make the cured body white for applications, such as a reflector, i.e. reflecting board, in an optical semiconductor device. As the white pigments (white coloring agent), for instance, titanium dioxide, alumina, zirconium oxide, zinc sulfide, zinc oxide, and magnesium oxide can be used alone or in combination with titanium dioxide. Among these, titanium dioxide, magnesium oxide, and alumina are preferred, and titanium dioxide is more preferred. A crystal form of the titanium dioxide may be of any type, such as rutile type, anatase type, and Brookite type, and rutile type one is preferred.

The white pigment preferably has an average particle diameter of from 0.05 to 10.0 μm, more preferably from 0.1 to 5.0 μm, even more preferably from 0.1 to 1.0 μm. The white pigment may be surface treated in advance, for instance, with a hydroxide of Al or Si in order to enhance its miscibility or dispersibility with resin component (A) or (E) or inorganic fillers (C). The average particle diameter can be determined as mass average $D_{50}$ or median diameter in a particle size distribution measurement by a laser light diffraction method.

An amount of the white pigment to be added is from 3 to 200 parts by mass, preferably from 5 to 150 parts by mass, particularly from 10 to 120 parts by mass relative to 100 parts by mass of component (A). If the amount is less than 3 parts by mass, it is sometimes difficult to attain sufficient whiteness, an initial reflectance ratio of 70% or higher of a cured body, and a reflectance ratio of 70% or higher after a degradation test by heating at 180 degrees C. for 24 hours. If the amount exceeds 200 parts by mass, such a problem might cause that a content of inorganic filler (C) must be reduced which is added for enhancing mechanical strength. The amount of this white pigment is preferably in a range of from 1 to 50% by mass, more preferably from 5 to 30% by mass, most preferably from 10 to 30% by mass, relative to a total amount of the silicone resin composition.

(C) Inorganic Filler

Inorganic filler (C) is a filler other than the afore-mentioned white pigment. Those which are generally blended in epoxy resin compositions can be used. Examples of the fillers include silicas such as fused silica, spherical fused silica, and crystalline silica; silicon nitride; aluminium nitride; boron nitride; and antimony trioxide. An average particle diameter and shape of these inorganic fillers are not particularly limited, but is generally from 5 to 50 μm. The average particle diameter can be determined as a mass average $D_{50}$ or median diameter in a particle size distribution measurement by a laser light diffraction method as described above.

Particularly, fused silica and spherical fused silica are preferred. The upper limit of the average particle diameter is 50 μm, preferably 45 μm, and the lower limit thereof is 5 μm, preferably 7 μm, more preferably 10 μm for better moldability and flowability. For higher flowability of the resin composition, it is desirable to combine the one in a fine particle size zone with the average particle size of 3 μm or less, the one in a medium particle size zone with the average particle size of 4 to 8 μm, and the one in a coarse zone with the average particle size of 10 to 50 μm so that the average particle diameter falls within the afore-mentioned range. Especially in a case where a composition is used to form a pre-molded package or in underfill having a narrow part, particularly desirable is an inorganic filler whose average particle diameter is one half the thickness of the afore-said narrow part.

The afore-mentioned inorganic filler may be surface treated with a coupling agent such as a silane coupling agent and a titanate coupling agent, for higher bond strength between the resin and the inorganic filler.

As the afore-mentioned coupling agents, use may preferably be made of epoxy-functional alkoxysilanes such as gamma-glycidoxypropyltrimethoxysilane, gamma-glycidoxypropylmethyldiethoxysilane, and beta-(3,4-epoxycyclohexyl)ethyltrimethoxysilane; amino-functional alkoxysilanes such as N-beta-(aminoethyl)-gamma-aminopropyltrimethoxysilane, gamma-aminopropyltriethoxysilane, and N-phenyl-gamma-aminopropyltrimethoxysilane; and mercapto-funcational alkoxysilane such as gamma-mercaptopropyltrimethoxysilane. The amount of the coupling agent for the surface treatment and a method of the surface treatment are not restricted to any particular ones.

The amount of the inorganic filler to be added is preferably from 400 to 1000 parts by mass, particularly from 600 to 950 parts by mass, relative to 100 parts by mass of component (A). If the amount is less than 400 parts by mass, a desired linear expansion coefficient may not be attained. If the amount exceeds 1000 parts by mass, a mold may not be fully filled due to an increased viscosity, or flexibility may be lost and, therefore, defects such as abrasion in an element may occur. A total amount of the inorganic filler and the white pigment is preferably from 70 to 93% by mass, particularly from 75 to 91% by mass, relative to the total mass of the silicone resin composition.

(D) Condensation Catalyst

Condensation catalyst (D) is for curing the afore-mentioned component (A) and selected, considering, for instance, storage stability of component (A) and desired stiffness. Examples of the condensation catalysts include basic compounds such as trimethylbenzylammonium hydroxide, tetramethylammonium hydroxide, n-hexylamine, tributylamine, diazabicycloundecene (DBU) and dicyandiamide; metal-containing compounds such as tetraisopropyl titanate, tetrabutyl titanate, titanium acetylacetonate, aluminum triisobutoxide, aluminum triisopropoxide, zirconium tetra (acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminium phosphate, and aluminium triisopropoxide; organic titanium chelate compounds such as aluminium trisacetylacetonate, aluminium bisethylacetoacetate monoacetylacetonate, diisopropoxybis(ethylacetoacetate)titanium, and diisopropoxybis(ethylacetoacetate)titanium. Among these, zinc octylate, zinc bezoate, zinc p-tert-butylbenzoate, zinc laurate, zinc stearate, aluminium phosphate, and aluminium triisopropoxide, particularly zinc benzote and aluminium triisopropoxide, are preferred.

The amount of the curing catalyst to be added is from 0.01 to 10 parts by mass, preferably from 0.1 to 6 parts by mass, relative to 100 parts by mass of (A). Within the afore-mentioned range, curing is good and storage stability of the composition is also good.

(E) Organopolysiloxane

Component (E) is characterized in that it comprises a linear diorganopolysiloxane moiety which is represented by the following formula (2).

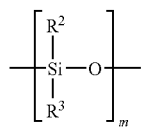
(2)

wherein $R^2$ and $R^3$ are, independently of each other, a group selected from the group consisting of a hydroxyl group, an alkyl group having 1 to 3 carbon atoms, a cyclohexyl group, a vinyl group, a phenyl group and an allyl group, preferably a methyl group and a phenyl group. m is an integer of from 5 to 50, preferably from 8 to 40, and more preferably 10 to 35. If m is less than 5, the cured body is poor in flexibility, i.e., crack resistance, and, therefore, warpage of a device may occur. Meanwhile, if m exceeds 50, mechanical strength tends to be insufficient.

Component (E) may comprise unit D ($R_2SiO_{2/2}$), unit M ($R_3SiO_{1/2}$), and unit T ($RsiO_{3/2}$) in addition to unit D ($R^2R^3SiO_{2/2}$) which is represented by the afore-mentioned formula (2). The mole ratio of unit T ($RSiO_{3/2}$):unit M ($R_3SiO_{1/2}$): unit D ($R_2SiO_{2/2}$) other than unit D ($R^2R^3SiO_{2/2}$) is preferably 90-24:75-0:50-1, particularly 70-28:70-20:10-2, for good properties of the cured body. In the afore-mentioned units, R represents a hydroxyl group, a methyl group, an ethyl group, a propyl group, a cyclohexyl group, a phenyl group, a vinyl group, or an allyl group. Component (E) may comprise unit Q ($SiO_2$).

Preferably, 30 mole % or higher, particularly 50 mole % or higher, of organopolysiloxane (E) constitutes, in a molecule, the linear diorganopolysiloxane structure which is represented by the general formula (2).

The weight average molecular weight of component (E), reduced to polystyrene, determined by gel permeation chromatography (GPC), is preferably from 3,000 to 1,000,000, more preferably from 10,000 to 100,000. When the molecular weight is within the afore-mentioned range, the polymer is solid or a semi solid and, therefore, is suitable for workability and curability.

Component (E) can be prepared by combining compounds which would constitute the afore-mentioned units in such a ratio that a desired mole ratio among the units is obtained in the resulting polymer and carrying out hydrolysis and condensation in the presence of, for instance, an acid.

Examples of the raw materials for unit $RSiO_{3/2}$ include chlorosilanes such as $MeSiCl_3$, $EtSiCl_3$, $PhSiCl_3$, propyltrichlorosilane, and cyclohexyltrichlorosilane; and alkoxysilanes corresponding to the afore-mentioned chlorosilanes, such as methoxysilanes.

Examples of the raw materials for unit $R^2R^3SiO_{2/2}$ represented by the afore-mentioned formula (2) include

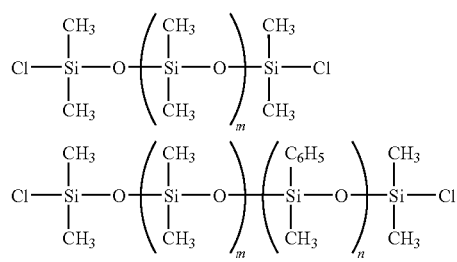

-continued

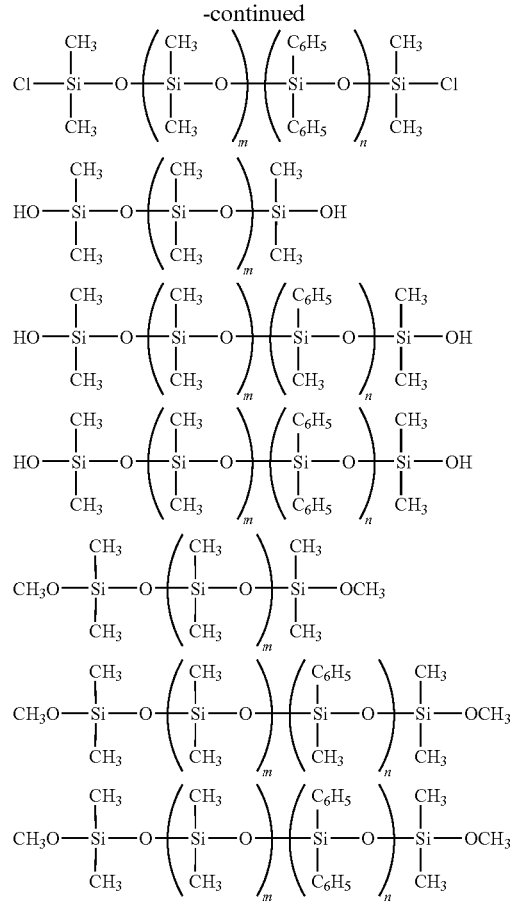

wherein m is the number of from 3-48 on average, n is the number of from 0 to 48 on average, provided that a total of m and n is the number of from 3 to 48 on average.

Examples of the raw materials for unit M and unit D include chlorosilanes such as $Me_2PhSiCl$, $Me_2ViSiCl$, $MePhSiCl_2$, $MeViSiCl_2$, $Ph_2MeSiCl$, $Ph_2ViSiCl$, and $PhViSiCl_2$; and alkoxysilanes corresponding to the afore-mentioned chlorosilanes such as methoxysilanes, wherein Me represents a methyl group; Et, an ethyl group; Ph, a phenyl group, and Vi, a vinyl group.

Component (E) can be obtained by combining the afore-mentioned raw materials in a particular mole ratio, for instance, as follows. 100 Parts by mass of phenylmethyldichlorosilane, 2100 parts by mass of phenyltrichlorosilane, 2400 parts by mass of a silicone oil having 21 Si atoms and chlorodimethyl groups on both ends, and 3000 parts by mass of toluene are mixed. Then, the mixture of the silanes is added dropwise to 11000 parts by mass of water, subsequently, hydrolyzed at a temperature of from 30 to 50 degrees C. for 1 hour and aged at 50 degrees C. for 1 hour. Then, water is added for washing and, subsequently, an organic phase is subjected to azeotropic dehydration, filtration, and strip under reduced pressure.

A siloxane unit having a silanol group may be incorporated into organopolysiloxane (E) in the afore-mentioned hydrolysis and condensation step. The siloxane unit having a silanol group is contained generally in a content of from 0.5 to 10 mole %, preferably from 1 to 5 mole %, relative to the total moles of the silixoane units. Examples of the afore-mentioned siloxane unit having a silanol group include unit $R(HO)SiO_{2/2}$, unit $R(HO)_2SiO_{1/2}$, and unit $R_2(HO)SiO_{1/2}$, wherein R is not a hydroxyl group. The organopolysiloxane has a silanol group and, therefore, reacts with component (A), curable organopolysiloxane.

The amount of component (E) to be added is preferably from 2 to 50 parts by mass, more preferably from 3 to 30 parts by mass, relative to 100 parts by mass of component (A). If the amount is less than the afore-mentioned lower limit, the effect of improving continuous moldability is less and the low warpage cannot be attained. If the amount is more than the afore-mentioned upper limit, a viscosity of the composition is so high that molding may be difficult.

(F) Other Additives

The present silicone resin composition may further comprise, if needed, various kinds of additives. For instance, the present composition may comprise mercapto functional alkoxy silanes such as gamma-mercaptopropyltrimethoxysilane; coupling agents such as gamma-glycidoxypropyltrimethoxysilane, gamma-glycidoxypropylmethyldiethoxysilane, and beta-(3,4-epoxycyclohexyl)ethyl trimethoxysilane; additives such as whiskers, silicone powder, thermoplastic resins, thermoplastic elastomers, and organic synthetic rubber; internal releasing agents such as esters of aliphatic acids, esters of glyceric acid, zinc stearate, and calcium stearate; and antioxidants of phenol type, phosphorus type, and sulfur type in such an amount that the effects of the present invention are not damaged. It should be noted that the present composition shows less discolor by light, compared to conventional thermosetting silicone resin compositions, even when the present composition does not comprise any antioxidant.

The present composition can be prepared by blending the silicone resin, the white pigment, the inorganic filler, the curing catalyst, and optional other additives in a predetermined ratio, stirring the resulting mixture sufficiently with, for instance, a mixer, melt mixed with, for instance, hot rolls, a kneader, an extruder, cooled to solidify, and pulverized into a suitable size to obtain the silicone resin composition for molding. The linear expansion coefficient of the cured body of the present silicone resin composition is from 10 ppm/K to 30 ppm/K, preferably from 10 ppm/K to 20 ppm/K at a temperature or higher of the glass transition temperature.

Figure 2:
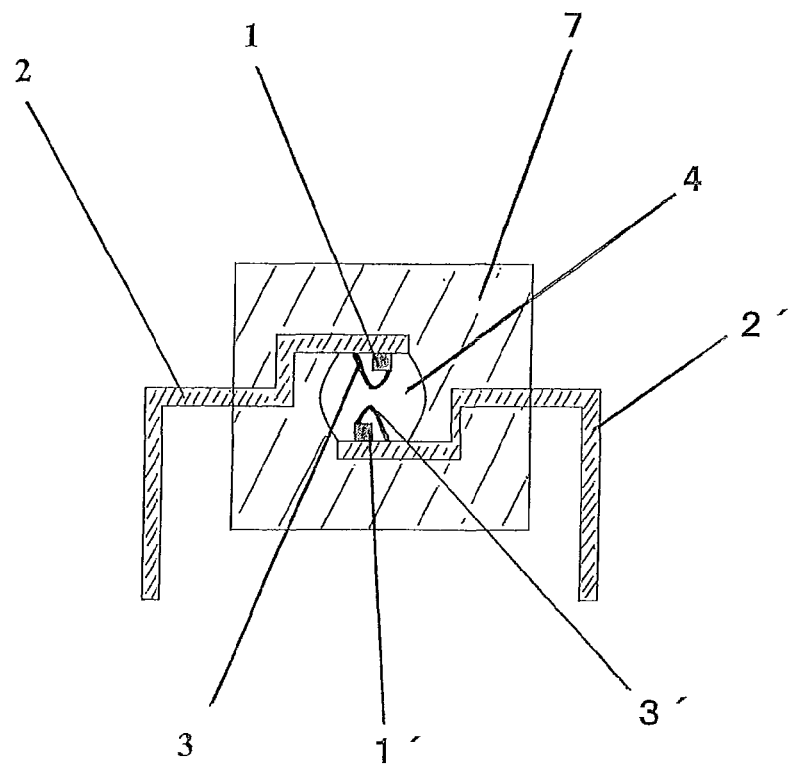
FIG. 2 is a cross sectional view which indicates an example of a photo coupler where the silicone resin composition of the present invention is adopted.

The silicone resin composition thus obtained is particularly useful as an encapsulating agent for optical semiconductor devices, specifically LED cases, and photo couplers. FIG. 1 shows a cross section of an example of an optical semiconductor device. In FIG. 1, optical semiconductor element 1, such as an LED, is die bonded to lead frame 2 and further wire bonded via bonding wire 3 to another lead frame 2'. The space between these semiconductor elements is filled with transparent encapsulating resin 4. In the example illustrated in FIG. 1, a cured body of the present silicone resin composition constitutes white reflector 5. Numeral 6 indicates a lens. FIG. 2 shows a cross section of an example of a photo coupler. In FIG. 2, semiconductor element 1 is die bonded to lead frame 2 and further wire bonded via bonding wire 3 to another frame (not shown behind lead frame 2 in FIG. 2). Semiconductor element 1' for receiving light is die bonded to lead frame 2' so that semiconductor element 1' faces semiconductor element 1. Semiconductor element 1' is further wire bonded via bonding wire 3' to another lead frame (not shown behind lead frame 2' in FIG. 2). The space between these semiconductor elements is filled with transparent encapsulating resin 4. The semiconductor elements which are surrounded with transparent encapsulating resin 4 is further encapsulated with the present silicone resin composition 7.

The reflector thus obtained initially has a light reflectance at a wavelength of 450 nm of 70% or higher, particularly 80% or higher, above all 85% or higher. After a degradation test at 180 degrees C. for 24 hours, the reflector has a reflectance of 70% or higher, particularly 80% or higher, above all 85% or higher. If the reflectance after the degradation test is less than 70%, the durability as a reflector for an LED semiconductor element is short.

As the most common molding method of the reflector, mention is made of transfer molding and compression molding. The transfer molding is carried out using a transfer molding machine, preferably at a molding pressure of 5 to 20 N/mm$^2$ at a molding temperature of 120 to 190 degrees C. for a molding time of 30 to 500 seconds, particularly at a molding temperature of 150 to 185 degrees C. for a molding time of 30 to 180 seconds. In the compression molding, molding is carried out using a compression molding machine, preferably at a molding temperature of from 120 to 190 degrees C. for a molding time of from 30 to 600 seconds, specifically at a temperature of from 130 to 160 degrees C. for 120 to 300 seconds. In both of the molding methods, post curing may be carried out at a temperature of from 150 to 185 degrees C. for 2 to 20 hours.

The silicone resin composition of the present invention thus obtained has good moldability and heat and light resistance, particularly ultraviolet ray resistance and, therefore, is suitable for a pre-molded package for white, blue, and, further, ultraviolet LED as well as for a packaging material for solar cells.

Further, the present invention also encompasses a pre-molded package which is prepared by integrally encapsulating, with the present composition, a metal substrate or an organic substrate of matrix array type with a lead part or a pad part thereon, while leaving a position for an LED element to be molded open. The present composition can also be used for encapsulating general semiconductors or various modules to be installed in vehicles.

EXAMPLES

The present invention will be explained more in detail in the following Examples and Comparative Examples. However, the present invention shall not be limited to the Examples.

The raw materials used in the Examples and the Comparative Examples are as follows.

Synthesis Example 1

Organopolysiloxane (A)

To a one litter flask were added 100 parts by mass of methyltrichlorosilane and 200 parts by mass of toluene. To the resulting mixture, was dropwise added a mixture of 8 parts by mass of water and 60 parts by mass of isopropyl alcohol over 5 to 20 hours while keeping the inner temperature at −5 to 0 degree C. by cooling the reactor in an ice bath. Then, the mixture was heated with stirring at a refluxing temperature for 20 minutes, and cooled to room temperature, to which 12 parts by mass of water was dropwise added at a temperature below 30 degrees C. over 30 minutes and the mixture was stirred for 20 minutes. Further, 25 parts by mass of water was dropwise added and stirred at a temperature of from 40 to 45 degrees C. for 60 minutes. Then, 200 parts by mass of water were added and an organic phase was separated. The organic phase was washed until the phase became neutral and then subjected to azeotropic dehydration, filtration, and strip under reduced pressure to obtain 36.0 parts by mass of a colorless and transparent solid (melting point, 76 degrees C.), thermosetting organopolysiloxane (A) represented by the following formula (7).

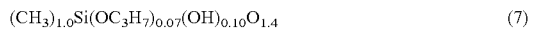
$$(CH_3)_{1.0}Si(OC_3H_7)_{0.07}(OH)_{0.10}O_{1.4} \qquad (7)$$

(B) White Pigment

White pigment: titanium dioxide (rutile type); average particle diameter, 0.29 μm; R-45M (trade name ex Sakai Chemical Industry Co., Ltd.)

(C) Inorganic Filler

The inorganic filler had an average particle diameter of 43 μm and consisted of:
95 parts by mass of spherical fused silica which has an average particle diameter of 45 μm, MSR-4500TN (ex Tatsumori Co., Ltd); and
5 parts by mass of spherical alumina which had an average particle diameter of 0.5 μm, SO 25 R (ex Admatechs Co., Ltd).

(D) Curing Catalyst

Zinc benzoate, ex Wako Pure Chemical Industries Ltd.

Synthesis Example 2

Organopolysiloxane (E)

100 Grams (4.4 mole %) of phenylmethyldichlorosilane, 2100 g (83.2 mole %) of phenyltrichlorosilane, 2400 g (12.4 mole %) of silicone oil having 21 Si atoms and chlorodimethyl groups on both ends, 3000 g of toluene were mixed and added dropwise to 11000 g of water and hydrolyzed at a temperature of from 30 to 50 degrees C. for 1 hour. Then, the mixture was aged at 50 degrees C. for 1 hour, to which water was added for washing. Then, the organic phase was subjected to azeotropic dehydration, filtration, and strip under reduced pressure to obtain colorless and transparent organopolysiloxane (E) which had a melt viscosity of 5 Pa·s at 150 degrees C.

Synthesis Example 3

Preparation of a Preliminary Reaction Product of an Epoxy Resin for Comparison

45 Grams of 1,3,5-tris(2,3-epoxypropyl) isocyanurate, TEPIC-S (trade name, ex Nissan Chemical Industries, Ltd., epoxy equivalent, 100), was blended with 55 g of methyl hexahydrophthalic anhydride, RIKACID MH (trade name ex New Japan Chemical Co., Ltd.) in a blend mole ratio of epoxy group/acid anhydride=1.4. The resulting mixture was heated at 80 degrees C. for 10 hours to react the epoxy resin with the acid anhydride to obtain the preliminary reaction product.
Additives
Silane coupling agent: KBM803, ex Shin-Etsu Chemical Co., Ltd.
Releasing agent: stearyl stearate, RikemalSL-900A, ex Riken Vitamin Co., Ltd.

Examples 1 to 5, Reference Examples 1 to 3 and Comparative Examples 1 to 3

In a formulation shown in Table 1 (in parts by mass), organopolysiloxane (A), white pigment (B), inorganic filler (C), curing catalyst (D), and organopolysiloxane (E) were mixed, kneaded in roll mixing, cooled and pulverized to obtain a white silicone resin composition.

For these compositions, the following properties were determined. The results are as shown in Table 1. Molding was carried out in a transferring molding machine at a molding temperature of 175 degrees C. for a molding time of 120 seconds.

Spiral Flow Value

Using a mold according to Epoxy Molding Materials Institute (EMMI) Standards, a spiral flow value was determined at a molding temperature of 175 degrees C. and a molding pressure of 6.9 N/mm$^2$ for a molding time of 120 seconds.

Using a Koka type flow tester provided with a 1 mm-diameter nozzle, a melt viscosity was measured at 175° C. and at a pressure of 25 kgf.

Bending Strength and Bending Modulus at Room Temperature

A specimen was prepared by molding at a molding temperature of 175 degrees C. and a molding pressure of 6.9N/mm$^2$ for a molding time of 120 seconds using a metal die according to JIS-K6911. The bending strength of the specimen was measured at room temperature, 25 degrees C.

Continuous Moldability

MAP type packages of 50×50 mm having a Cu frame plated with Ag were continuously molded at a molding temperature of 175 degrees C. and a molding pressure of 6.9 N/mm$^2$ for a molding time of 120 seconds and were evaluated for releasability at the cavity, breakage of a runner and burrs. The number of the repeated molding was recorded until the resin was not released from the cavity, the runner broke, or a burr appeared.

Warpage

A 50×50 mm MAP package (Cu frame) was encapsulated with a resin of 45 mm×45 mm×0.5 mm at a molding temperature of 175 degrees C., a molding pressure of 6.9 N/mm$^2$ for a molding time of 120 seconds. Warpage of the cured body obtained was measured on a warpage measurement instrument.

Light Reflectance

A disc, cured body, of 50 mm in diameter and 50 mm in thickness was molded in the conditions of a molding temperature of 175 degrees C., a molding pressure of 6.9 N/mm$^2$ and a molding time of 90 seconds. Immediately after the molding, the disc was left at 180 degrees C. for 24 hours, irradiated with UV from a high-pressure mercury lamp having a peak wavelength of 365 nm and an output of 60 mW/cm, for 24 hours. A light reflectance at a wave length of 450 nm was measured using X-rite 8200, ex S. D. G. Co., Ltd.

Linear Expansion Coefficient

A cured body having 5×5×15 mm was prepared in the conditions of a molding temperature of 175 degrees C., a molding pressure of 6.9 N/mm$^2$, and a molding time 120 of seconds and subjected to post curing at 180 degrees C. for 4 hours. Then, a linear expansion coefficient was determined at a temperature rise rate of 5 degrees C./minute on TMA 8140 C, ex Rigaku Corporation.

TABLE 1

| Component in parts by mass | | | Example 1 | Example 2 | Example 3 | Example 4 | Example 5 | Reference Example 1 | Reference Example 2 | Reference Example 3 | Comparative Example 1 | Comparative Example 2 | Comparative Example 3 |
|---|---|---|---|---|---|---|---|---|---|---|---|---|---|
| (A) | Organopolysiloxane | | 97 | 95 | 90 | 85 | 80 | 99 | 50 | 85 | 100 | | |
| | Preliminary reaction product | | | | | | | | | | | | 100 |
| (B) | White pigment | Titanium dioxide | 160 | 160 | 160 | 160 | 160 | 160 | 160 | 38 | 160 | 160 | 160 |
| (C) | Inorganic filler (average particle diameter, 43 μm) | Spherical fused silica Spherical alumina | 600 | 600 | 600 | 600 | 600 | 600 | 600 | 280 | 600 | 600 | 600 |
| (D) | Condensation catalyst | Zinc benzoate | 1 | 1 | 1 | 1 | 1 | 1 | 1 | | 1 | 1 | 1 |
| (E) | Oganopolysiloxane | | 3 | 5 | 10 | 15 | 20 | 1 | 50 | 15 | | 100 | |
| Others | Silane coupling agent | KBM803 | 1 | 1 | 1 | 1 | 1 | 1 | 1 | | 1 | 1 | 1 |
| | Releasing agent | Rikemal SL-900A | | | | | | | | | | | 1 |
| Evaluation of properties | Spiral flow value | inch | 25 | 22 | 20 | 19 | 13 | 27 | 4 | 45 | 27 | Impossible to mold | 36 |
| | Melt viscosity | Pa·s | 73 | 77 | 82 | 92 | 147 | 60 | 360 | 10 | 58 | | 13 |
| | Bending strength | N/mm² | 65 | 63 | 54 | 50 | 46 | 68 | 40 | 40 | 70 | | 83 |
| | Continuous moldability | Number of shots | 200< | 200< | 200< | 200< | 200< | 3 | 120 | 200< | 4 | | 200< |
| | Warpage | mm | 1> | 1> | 1> | 1> | 1> | 2< | 1> | 2< | 2< | | 2< |
| | Linear expansion coefficient | ppm/K | 16 | 16 | 16 | 16 | 16 | 16 | 16 | 33 | 18 | | 30 |
| | Light reflectance (%) | Initial reflectance | 91 | 91 | 91 | 91 | 91 | 91 | 91 | 91 | 91 | | 91 |
| | | After heated | 91 | 91 | 91 | 91 | 91 | 90 | 91 | 91 | 91 | | 83 |
| | | After irradiated | 91 | 90 | 91 | 90 | 91 | 91 | 90 | 90 | 90 | | 89 |

As seen in Table 1, Reference Example 1 where the content of component (E) is too low and Comparative Example 1 where component (E) is not contained at all showed a large warpage. Meanwhile, Reference Example 2 where the content of (E) is too high and Comparative Example 2 where only component (E) is contained as the organopolysiloxane component, the flowability was bad, so that moldability was bad. Comparative Example 3 where the preliminary reaction product of the isocyanuric acid-derived epoxy resin with the acid anhydride is contained showed a much lower light reflectance after UV irradiation, i.e., bad weathering resistance. Contrary to these, the Examples of the present invention showed no decrease in light reflectance and less warpage.

INDUSTRIAL APPLICABILITY

The present resin composition is suitable for use in optical semiconductor devices, specifically reflectors.

DESCRIPTION OF THE SYMBOLS IN THE DRAWING

1 and 1': Semiconductor element
2 and 2': Lead frame
3 and 3': Bonding wire
4: Transparent encapsulating resin
5: White reflector (cured body of the silicone resin composition)
6: Lens
7: Cured body of the silicone resin composition

The invention claimed is:

1. A silicone resin composition for an optical semiconductor device, comprising
   (A) 100 parts by mass of an organopolysiloxane having a weight average molecular weight of from 500 to 20000, reduced to polystyrene, and represented by the following average compositional formula (1), $$(CH_3)_a Si(OR^1)_b (OH)_c O_{(4-a-b-c)/2} \quad (1)$$

wherein $R^1$ is an organic group having 1 to 4 carbon atoms and a, b, and c are numbers satisfying the equations: $0.8 \leq a \leq 1.5$, $0 \leq b \leq 0.3$, $0.001 \leq c \leq 0.5$, and $0.801 \leq a+b+c < 2$, (B) 3 to 200 parts by mass of a white pigment,
   (C) 400 to 1000 parts by mass of an inorganic filler other than said white pigment,
   (D) 0.01 to 10 parts by mass of a condensation catalyst, and
   (E) 2 to 50 parts by mass of an organopolysiloxane comprising a linear diorganopolysiloxane moiety represented by the following formula (2),

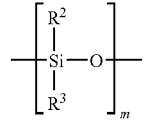

$$(2)$$

wherein $R^2$ and $R^3$ are, independently of each other, a group selected from the group consisting of a hydroxyl group, an alkyl group having 1 to 3 carbon atoms, a cyclohexyl group, a vinyl group, a phenyl group and an allyl group, and wherein m is an integer of from 5 to 50, and an $RSiO_{3/2}$ unit, an $R_3SiO_{1/2}$ unit, and an $R_2SiO_{2/2}$ unit other than the aforesaid linear diorganopolysiloxane moiety, wherein the mole ratio of $RSiO_{3/2}$ unit:$R_3SiO_{1/2}$ unit:$R_2SiO_{2/2}$ unit other than the aforesaid linear diorganopolysiloxane moiety is 90-24: 75-0: 50-1, and R is, independently of each other, a group selected from the group consisting of a hydroxyl group, a methyl group, an ethyl group, a propyl group, a cyclohexyl group, a phenyl group, a vinyl group, and an allyl group.

2. The silicone resin composition according to claim 1,
   wherein white pigment (B) is at least one selected from the group consisting of titanium dioxide, magnesium oxide and alumina, with their average particle diameters being 0.05 to 10.0 μm, and the content of (B) is 1 to 50% by mass relative to the mass of the silicone resin composition, and
   wherein a total mass of white pigment (B) and inorganic filler (C) is 70 to 93% by mass relative to the mass of the silicone resin composition.

3. The silicone resin composition according to claim 1 or 2, wherein a linear expansion coefficient of a cured body of the silicone resin composition is in a range of from 10 to 30 ppm/K at a glass transition temperature or higher of said cured body.

4. An optical semiconductor device provided with a cured body of the silicone resin composition according to claim 1 or 2.

* * * * *